United States Patent [19]

Williams et al.

[11] Patent Number: 5,097,581
[45] Date of Patent: Mar. 24, 1992

[54] ELECTRICAL POWER METER INSTALLING/REMOVING APPARATUS

[75] Inventors: Danny R. Williams; Wendell L. Brockett, both of Houston, Tex.

[73] Assignee: Houston Industries Incorporated, Houston, Tex.

[21] Appl. No.: 679,266

[22] Filed: Apr. 2, 1991

[51] Int. Cl.$^5$ ............................................. H05K 13/04
[52] U.S. Cl. ............................................. 29/278; 29/267
[58] Field of Search ............... 29/239, 240, 270, 271, 29/278, 267

[56] References Cited

U.S. PATENT DOCUMENTS

| | | | |
|---|---|---|---|
| 714,989 | 12/1902 | Worthington | 29/278 |
| 1,150,352 | 8/1915 | Enos | 29/278 |
| 2,294,542 | 9/1942 | Chulick et al. | 29/278 |
| 2,783,667 | 3/1957 | Wilson | 29/278 |
| 3,044,158 | 7/1962 | Bushnell | 29/278 |
| 3,322,380 | 5/1967 | Affel et al. | 29/278 |
| 3,699,629 | 10/1972 | Hood, Jr. et al. | 29/278 |
| 3,934,326 | 1/1976 | Owen et al. | 29/278 |

Primary Examiner—J. J. Hartman
Attorney, Agent, or Firm—Pravel, Gambrell, Hewitt, Kimball & Krieger

[57] ABSTRACT

An apparatus is provided for installing and/or removing an electrical power meter with an electrical power distribution box the apparatus includes a sleeve which slides over the protective cover of the meter. Clips or other engaging members which releasably engage an outer ring bout the meter are formed at one end of the sleeve. An unlocking collar is mounted about the sleeve to unlock the clip when the meter is being removed. A hand grip for a user is mounted at an opposite end of the sleeve. A transparent, shatterproof cover is mounted in the sleeve at the end where the grip is located. Vent ports are provided in the sleeve to permit outlet of any gases.

10 Claims, 2 Drawing Sheets

ELECTRICAL POWER METER INSTALLING/REMOVING APPARATUS

BACKGROUND OF INVENTION

1. Field of Invention

The present invention relates to apparatus for installing and removing electrical power meters.

2. Description of Prior Art

It has been necessary to periodically remove and replace electrical power meters from the electrical power distribution box or housing to which they are mounted. Conventionally, the inner workings of these meters have been enclosed within a suitable protective cover of transparent glass or synthetic resin. Improper application of force during installation or removal of the power meter could often result in breakage of the cover. Broken pieces of the cover caused a safety hazard, and a broken cover made it a difficult task to remove a meter still in place on the power distribution box.

U.S. Pat. No. 3,044,158 related to a gripping tool for installing and removing electrical power meters. This prior art gripping tool had engaging fingers which were adapted to fit into corresponding circumferentially disposed notches about the periphery of a band about a base portion of the meter. There usually have been several types of power meters in service for an electric utility company. Different types of meters had different notch arrangements: some had no notches for engagement by a gripping tool, while others had one, two, three or more. Thus, a gripping tool according to this prior art patent was not adapted for use with several different power meters types.

Other types of electrical power meter installing or removing tools were those set forth in U.S. Pat. Nos. 3,322,380 and 3,934,326. Structure for removing vacuum tubes used in radio or television communication before the advent of transistors and other solid state electronic components were set forth, for example, in U.S. Pat. Nos. 2,294,542 and 2,783,667.

SUMMARY OF INVENTION

Briefly, the present invention provides a new and improved apparatus for installing and a removing electrical power meters in service on power distribution boxes. As is conventional, the electrical power meters have a protective cover of transparent glass or other suitable material which extends outwardly from a meter band and encloses the inner workings of the meter.

The apparatus of the present invention includes a sleeve member which is adapted for sliding movement about the meter cover. Plural releasable gripping hook members of a suitable number are mounted on a first end of the sleeve member to selectively engage the meter band. A collar member is mounted with the sleeve member encircling the releasable gripping hooks. The collar member is movable along the sleeve member between a locking position, which allows the releasable gripping hooks to engage and lock onto the meter band, and a release position, which moves the releasable gripping hooks out of engagement with the meter band.

DESCRIPTION OF PREFERRED EMBODIMENT

Figures 1, 4:
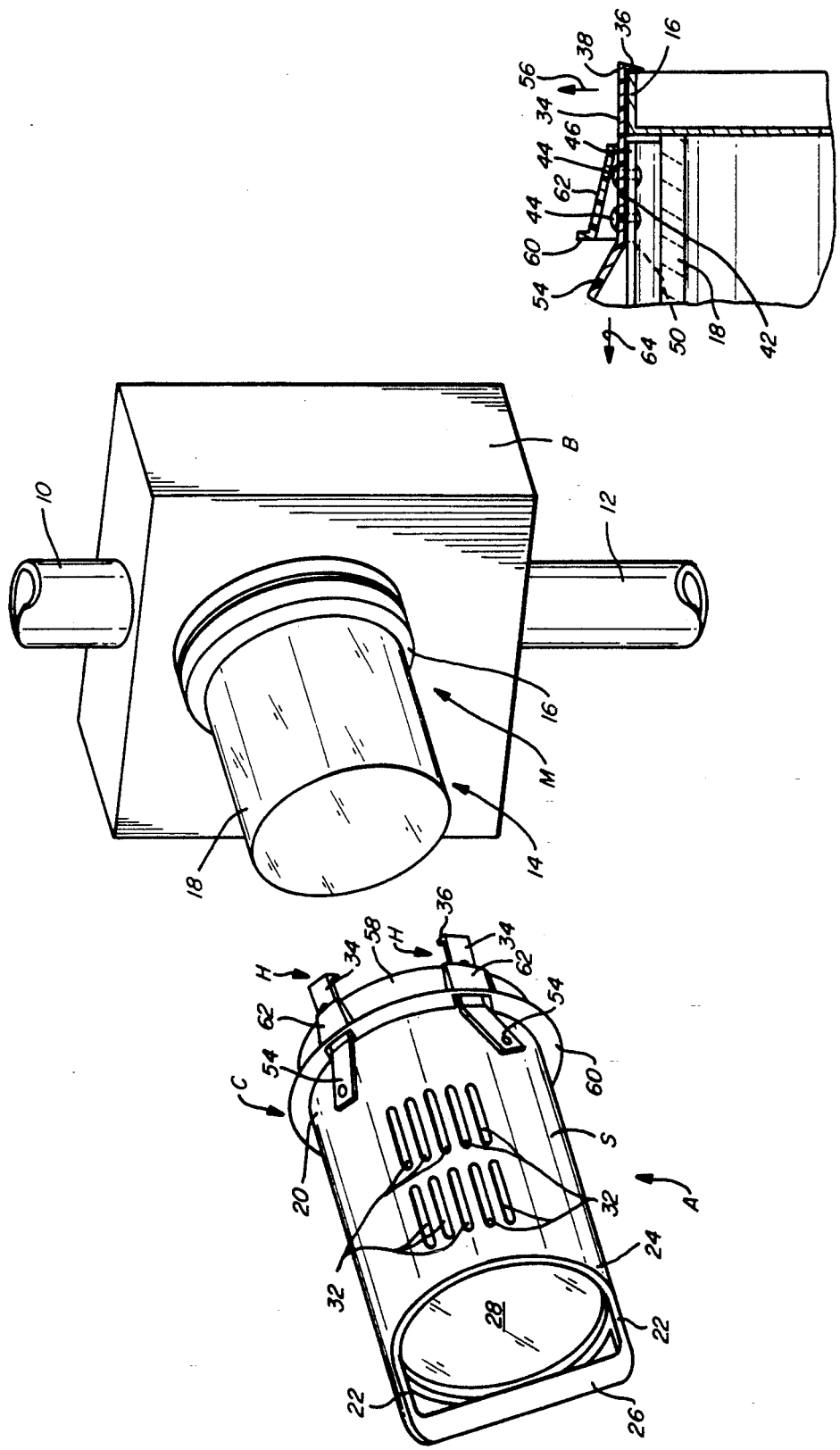
FIG. 1 is an isometric view of an apparatus according to the present invention with an electrical power meter and distribution box.
FIG. 4 is a sectional view illustrating in detail the portion circled in FIG. 2 and having the numeral "4" designating same.
Figure 2:
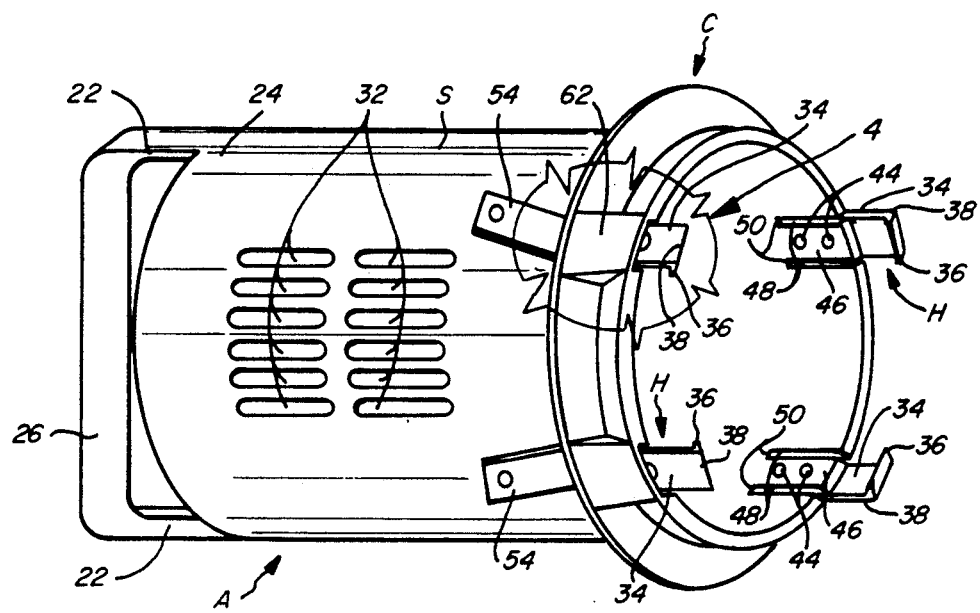
FIG. 2 is an isometric view of the apparatus of the present invention.

In the drawings, the letter A designates generally an apparatus according to the present invention for installing and removing an electrical power meter M on an electrical power distribution box or container B. The electrical power distribution box B is mounted in connection with conduits 10 and 12 containing electrical power distribution conductors, as is conventional.

Figure 3:
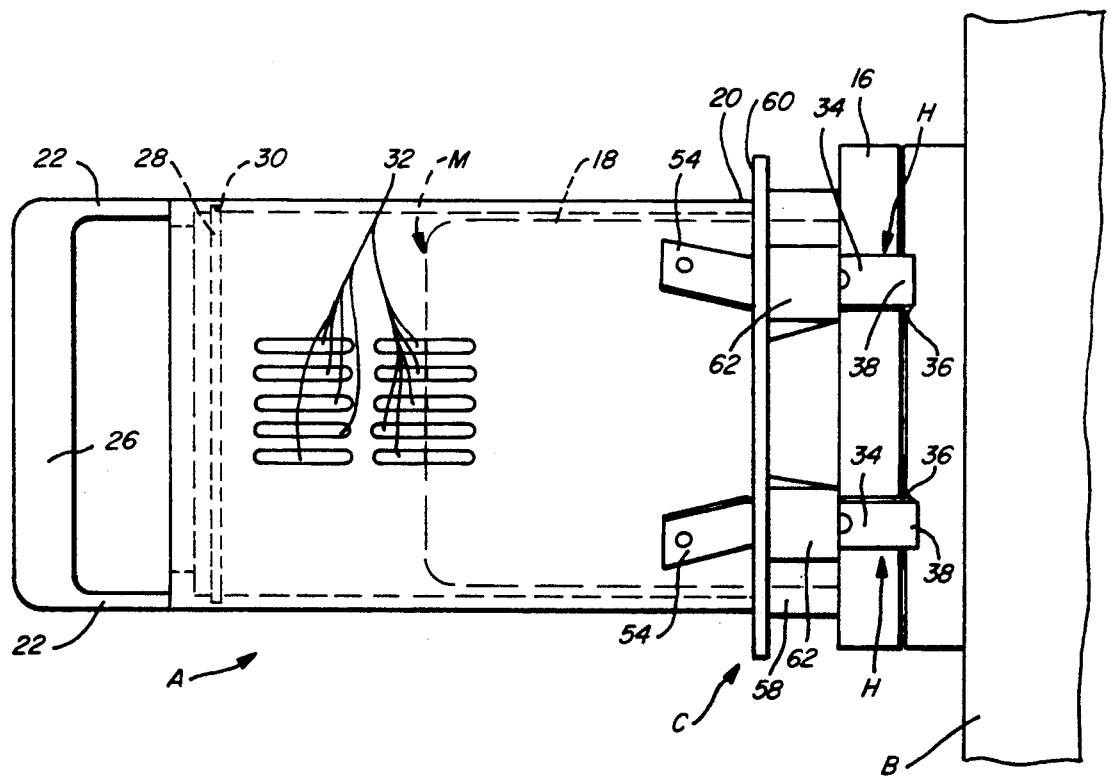
FIG. 3 is an elevation view of an apparatus of the present invention mounted with an electrical power meter on a distribution box.

The electrical power meter M may be of any suitable, conventional type, having a transparent protective cover or cup 14 of glass or a suitable synthetic resin. The protective cover 14 is transparent so that readings can be taken from the meter M and also contains the inner measurement workings of the meter M. The power meter M also includes a conventional meter band 16 formed about the protective cover 14 at a portion nearest the meter box B when installed (FIG. 3).

The apparatus A includes a hollow tubular or cylindrical sleeve member S adapted for sliding movement over and about an outer cylindrical or tapered side surface extent 18 of the meter cover 14. A plurality of releasable gripping hook members H are mounted on a first end 20 of the sleeve member S for selectively engaging the meter band 16 in a manner to be set forth.

The apparatus A further includes a collar member C mounted with the sleeve member S encircling the releasable gripping hooks H. As will be set forth, the collar member C is movable along the sleeve member S between a locking position (FIG. 3) allowing the gripping hooks H to engage and lock onto the meter band 16 and, alternatively, a releasing position which moves the releasable gripping hooks H out of engagement with the meter band 16.

The sleeve member S is of a suitable length so that the entire outward extent 18 of the meter cover 14 from the meter band 16 can be fitted therein past a first end portion 20. The sleeve member S also has an inner diameter slightly larger than the largest diameter of the side surface 18 of the meter cover 14 so that the cover 14 may fit within the sleeve member S. The sleeve member S is formed of a metal, alloy or synthetic resin of suitable strength.

The sleeve member S has attachment arms 22 extending rearwardly from an end 24 opposite the first end 20 with a hand grip 26 extending therebetween. The hand grip 26 may be integrally formed with the attachment arms 22 or may be a separate structural member attached thereto, if desired.

A transparent circular protective disk 28 (FIGS. 1 & 3) is mounted within an inner annular groove 30 (FIG. 3) in the end portion 24 of the sleeve member S. The protective disk 28 is formed from a suitable shatterproof material, such as synthetic resin, to protect a user/installer during installation or removal of the meter M in the event of explosion of the meter cover 14 or other form of breakage thereof. The transparent protective disk 28 further permits viewing of the contents of the meter M while it is within the sleeve member S.

The sleeve member S further has a suitable number of vent ports 32 formed in the opposite or rear portion 24 to permit the escape of any pressurized gas in the event of breakage or rupture of the protective cover 14 caused by fire or explosion of the meter M during installation or removal.

The hooking grips H are mounted equi-distantly about the periphery of the inner or first end 20 of the sleeve member S. A suitable number, typically three, or more, of hooking grips H are provided for equalization of load distribution forces. Each of the hooking grips H has a front portion 34 extending beyond the inner end 20 of the sleeve member S a sufficient distance to allow the meter band 16 to fit therein. An inner J- or V-shaped barb or prong member 36 is formed on a front portion 38 of the gripping hooks H so that a rearwardly tapering arm 40 (FIG. 4) may be slid past the meter band 16 to hold the meter band 16 in place in a locking position engaged with the hooking grip H.

The gripping hooks H further include a central, generally flat attachment portion 42 extending rearwardly from the front portion 34. Each of the attachment portions 42 extends along and is mounted by mounting studs 44 or other suitable attaching means with a tongue member 46 of the sleeve member S. The tongue members 46 are like in number to the gripping hooks H and are integral portions of the sleeve member S extending between adjacent longitudinal slots 48 formed in the sleeve member S extending to stop surfaces 50. As such, the tongue members 44 are slightly flexible with respect to the sleeve member S and can be pivotally moved with respect thereto.

Each of the gripping hooks H further includes a release tab 54 integrally formed to taper outwardly and extend rearwardly from the attachment portion 42. The release tabs 54 when depressed exert an upward pivotal force on the attachment portions 42 of gripping hooks H, and consequently on the tongue members 46 of the sleeve member S. Such force lifts the prong members 36 of the gripping hooks H upwardly as indicated by an arrow 56. Such pivotal movement of the prong members 36 moves them into an unlocking position out of engagement With the meter band 16.

The collar member C of the apparatus A includes an inner, generally cylindrical member 58 (FIG. 1) fitted over the attachment portion 42 of the gripping hooks H at the inner end 20 of the sleeve member S. A gripping rim 60 is formed extending outwardly from the cylinder member 58 so that a user may move the collar member C with respect to the sleeve member S.

The collar member C further includes a plurality of tapered camming slots 62 formed on the cylinder member 58. The camming slots 62 taper outwardly and rearwardly in the manner of the releasing tabs 50 and are located on the collar C at positions corresponding to the location of the gripping hooks H on the sleeve member S. In this manner, when the gripping collar C is moved rearwardly, as indicated by an arrow 64, the camming slots 62 engage the releasing tabs 54 and pivot the prong members 36 outwardly from the meter band 16. This action, as has been set forth, releases the gripping hooks H from the meter band 16. It is also to be noted that pivoting movement occurs contemporaneously for each of the gripping hooks H, so that a user need not use hand pressure on the individual release tabs 54 to release the meter M from the apparatus A.

In the operation of the apparatus A, to install a meter M, the meter M is slid inwardly into the sleeve member S until the prong members 36 of the gripping hooks H slide past the meter band 16 and snap into position (FIGS. 3 and 4) holding the meter M firmly in place in the sleeve S. The installing person may then align the conventional meter blades on the rear of the meter M with the meter jaws in the distribution box B. Once such alignment occurs, the installing person may then exert force on the sleeve member S through the hand grip 26, forcing the meter M into electrical and mechanical connection with the meter box B.

When it is necessary or desirable to remove a meter M from a box B, the sleeve member S is slid onto and over the meter cover 14 to a position where the prong members 36 of the gripping hooks H slide past the meter band 16 and snap into locking engagement (FIG. 3) therewith. Pulling force is then exerted on the sleeve member S through the hand grip 26, pulling the meter M away from the meter box B. Once the meter M has been removed, it may be released from the sleeve member S by moving the collar member C rearwardly until the camming slots 62 contact the release tabs 54 of the gripping hooks H so that the meter M may be released from the sleeve member S.

Having described the invention above, various modifications of the techniques, procedures, material and equipment will be apparent to those in the art. It is intended that all such variations within the scope and spirit of the appended claims be embraced thereby.

I claim:

1. An apparatus for installing and removing an electrical power meter which has a protective cover extending outwardly from a meter band, said apparatus comprising:

a sleeve member adapted for sliding movement about the meter cover;

a plurality of releasable gripping hooks mounted on a first end of said sleeve member for selectively engaging the meter band, said plurality of releasable gripping hooks each comprising:

an attaching hook member extending outwardly from said first end of said sleeve member;

an attachment portion mounted with said first end of said sleeve member for mounting said attaching hook member thereto; and a release tab extending rearwardly from said attachment portion and outwardly from said sleeve member;

collar means mounted with said sleeve member encircling said releasable gripping hooks, said collar means comprising:

an inner cylindrical member fitted over said plurality of releasable gripping hooks;

a gripping rim extending outwardly from said inner cylindrical number; and a plurality of camming slots, each formed in said inner cylindrical member and engagable with one of said release tabs of said plurality of gripping hooks, said collar means being movable along aid sleeve member between a locking position allowing said gripping hooks to engage and lock onto the meter band and a releasing position moving said releasable gripping hooks out of engagement with the meter band.

2. The apparatus of claim 1, further including:

a plurality of movable tongue members formed in said sleeve member extending inwardly from said first end thereof.

3. The apparatus of claim 2, wherein:

said attachment portions of said plurality of releasable gripping hooks are each mounted with one of said movable tongue members.

4. The apparatus of claim 1, further including:
a plurality of movable tongue members of like number to said plurality of releasable gripping hooks formed in said sleeve member extending inwardly from said first end thereof.

5. The apparatus of claim 1, wherein:
said collar means is slidably movable along said sleeve member.

6. The apparatus of claim 1, further including:
hand grip means formed at an opposite end of said sleeve member from said first end for allowing a user to move said sleeve member.

7. The apparatus of claim 1, wherein:
said sleeve member has an opening formed in said first end of a size for entry of the protective cover of the electrical power meter.

8. The apparatus of claim 1, further including:
protective disk means mounted in an opposite end of said sleeve member from said first end.

9. The apparatus of claim 8, wherein:
said protective disk means is formed of a transparent material.

10. The apparatus of claim 1, further including:
vent ports formed in said sleeve member at an opposite end thereof from said first end for allowing gases to exit said sleeve member.

* * * * *